(12) United States Patent
Yoshitomi

(10) Patent No.: US 7,949,975 B2
(45) Date of Patent: May 24, 2011

(54) APPARATUS AND METHOD OF EXTRACTING EQUIVALENT CIRCUIT OF T-TYPE TRANSMISSION CIRCUIT

(75) Inventor: Sadayuki Yoshitomi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 342 days.

(21) Appl. No.: 12/200,193

(22) Filed: Aug. 28, 2008

(65) Prior Publication Data

US 2009/0064060 A1 Mar. 5, 2009

(30) Foreign Application Priority Data

Aug. 31, 2007 (JP) ................................ 2007-225824

(51) Int. Cl.
*G06F 17/50* (2006.01)
(52) U.S. Cl. ............... 716/111; 716/136; 703/2; 703/14
(58) Field of Classification Search .......... 716/5; 703/2, 703/14
See application file for complete search history.

(56) References Cited

U.S. PATENT DOCUMENTS

| | | | | |
|---|---|---|---|---|
| 6,725,430 | B2 * | 4/2004 | Draxler et al. | 716/1 |
| 7,337,087 | B2 * | 2/2008 | Nagata et al. | 702/117 |
| 2002/0193977 | A1 * | 12/2002 | Elco | 703/15 |
| 2003/0101418 | A1 * | 5/2003 | Draxler et al. | 716/1 |
| 2007/0276642 | A1 | 11/2007 | Huszka | |

OTHER PUBLICATIONS

Kamgaing, et al., Modeling of Frequency Dependent Losses in Two-port and Three-port Inductors on Silicon, IEEE Radio Frequency, Integrated Symposium, pp. 307-310, 2002.
Aguilera, et al., Design and Test of Integrated Inductors for RF Applications, Kluwer Academic Publishers, ISBN 1-4020-7676-2, pp. 34, 44-47.
"Modeling of Monolithic Inductors and Transformers for Silicon RFIC Design", MTT-S 1995 International Topical Symposium pp. 129-134, 1995.

* cited by examiner

*Primary Examiner* — Phallaka Kik
(74) *Attorney, Agent, or Firm* — Turocy & Watson, LLP

(57) ABSTRACT

A method of extracting an equivalent circuit of a T-type transmission circuit measures signals of the first and second terminals to obtain S parameters, converts the S parameters into Z parameters to generate a T-type circuit by using the Z parameters, obtains first to third lead line resistors and first to third lead line inductors in the T-type circuit based on the Z parameters corresponding to constants of the T-type circuit, subtracts the Z parameters corresponding to the T-type circuit from the Z parameters corresponding to all of the equivalent circuit to calculate the Z parameters of a π-type circuit, converts the Z parameters of the π-type circuit into the Y parameters, and calculates first to third coupling capacitances based on the Y parameters.

20 Claims, 9 Drawing Sheets

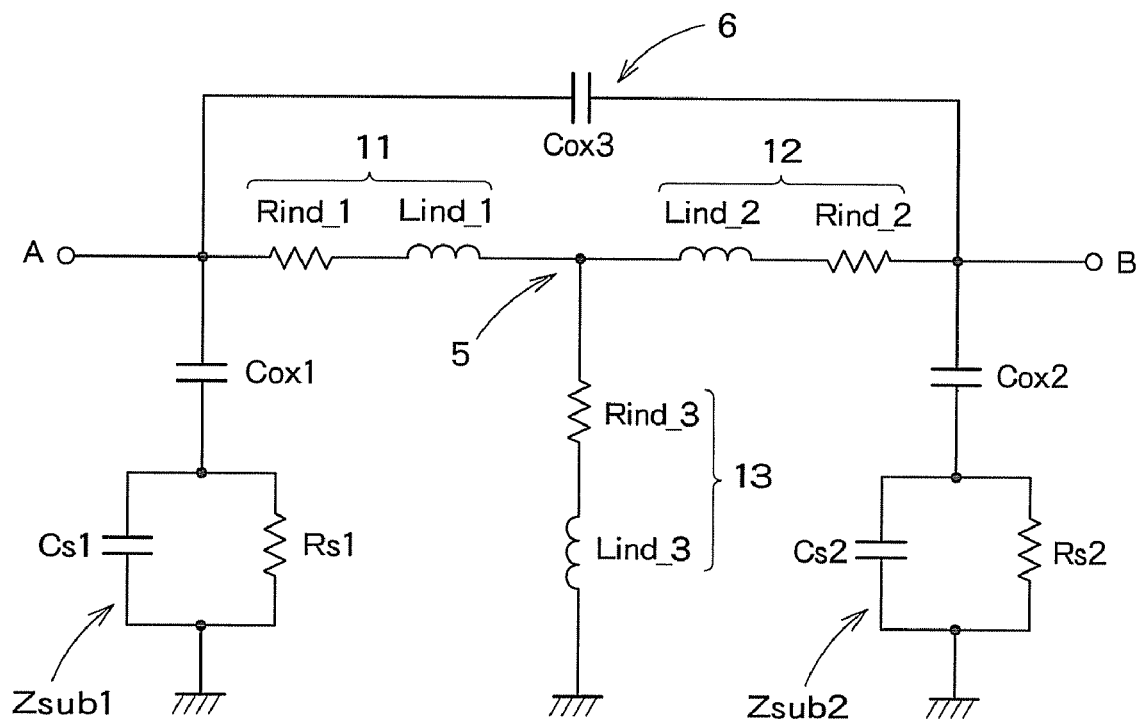
F I G. 2

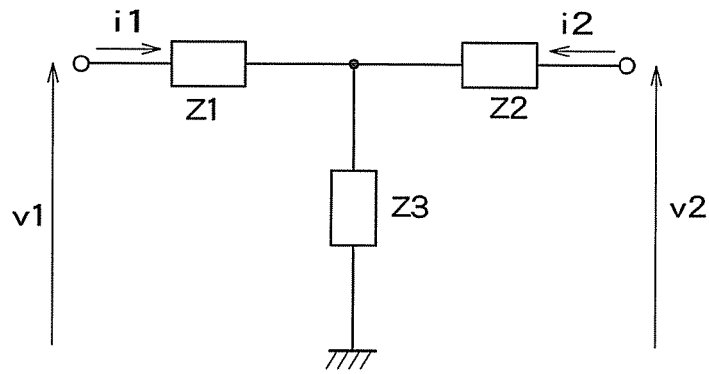
F I G. 5
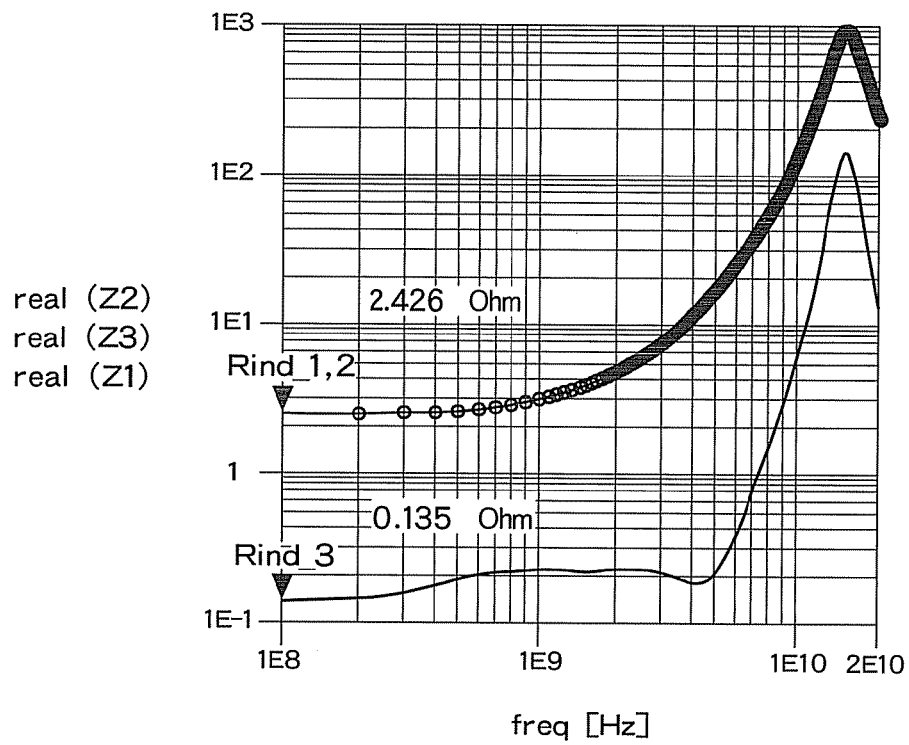
F I G. 6

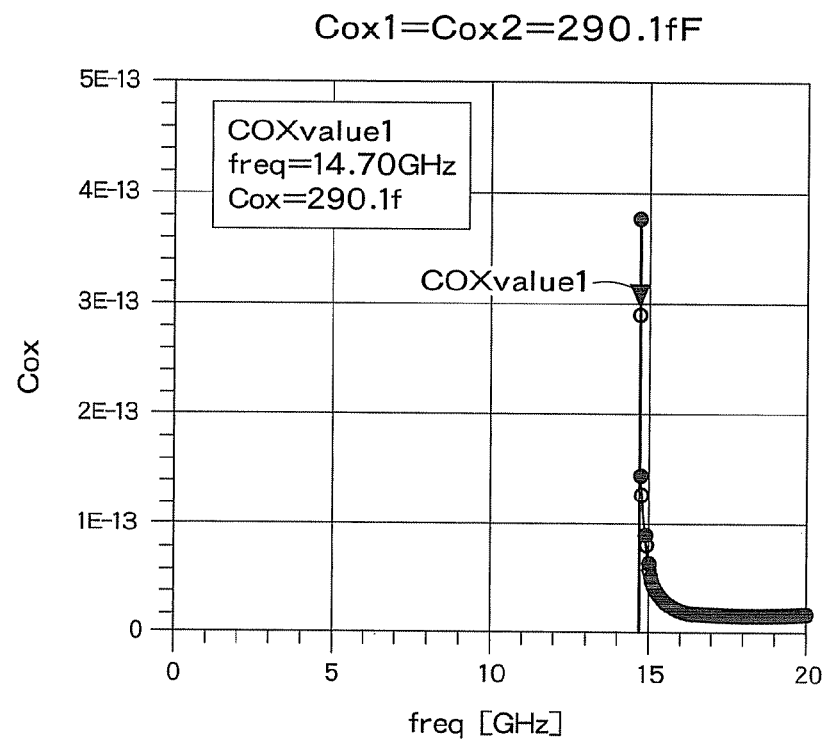
F I G. 9
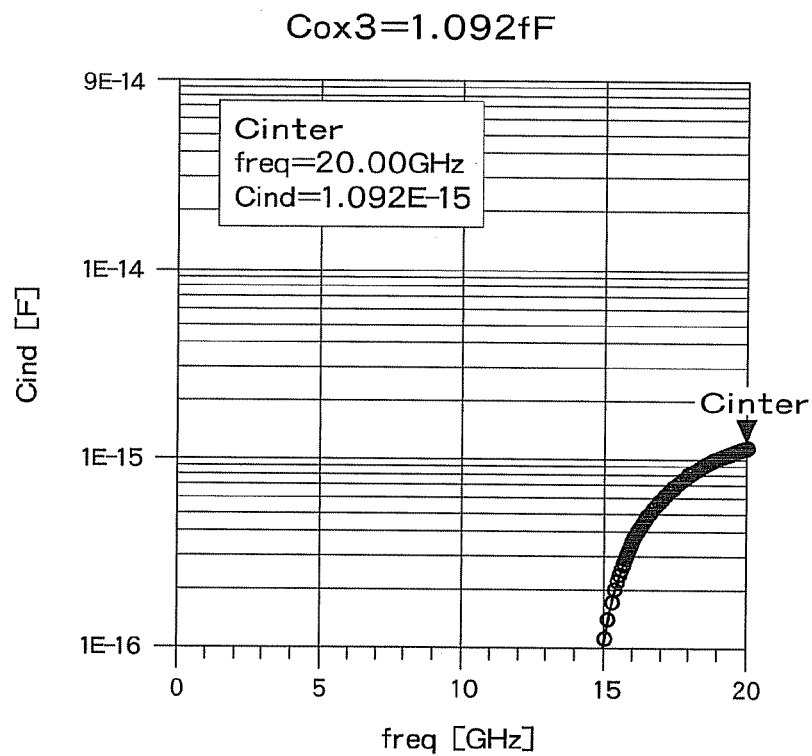
F I G. 10

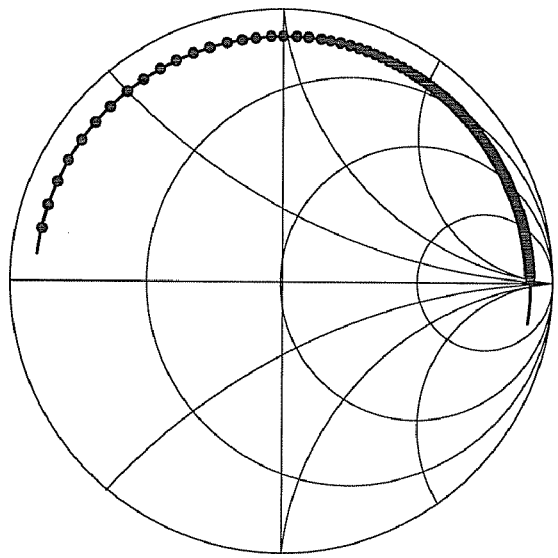
freq (100.0MHz to 20.00GHz)
F I G. 13A
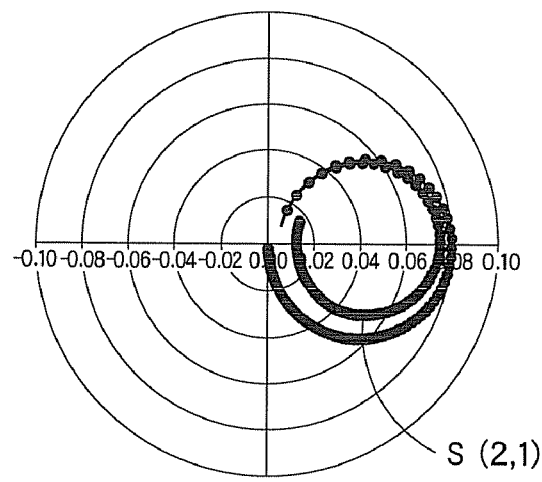
freq (100.0MHz to 20.00GHz)
F I G. 13B

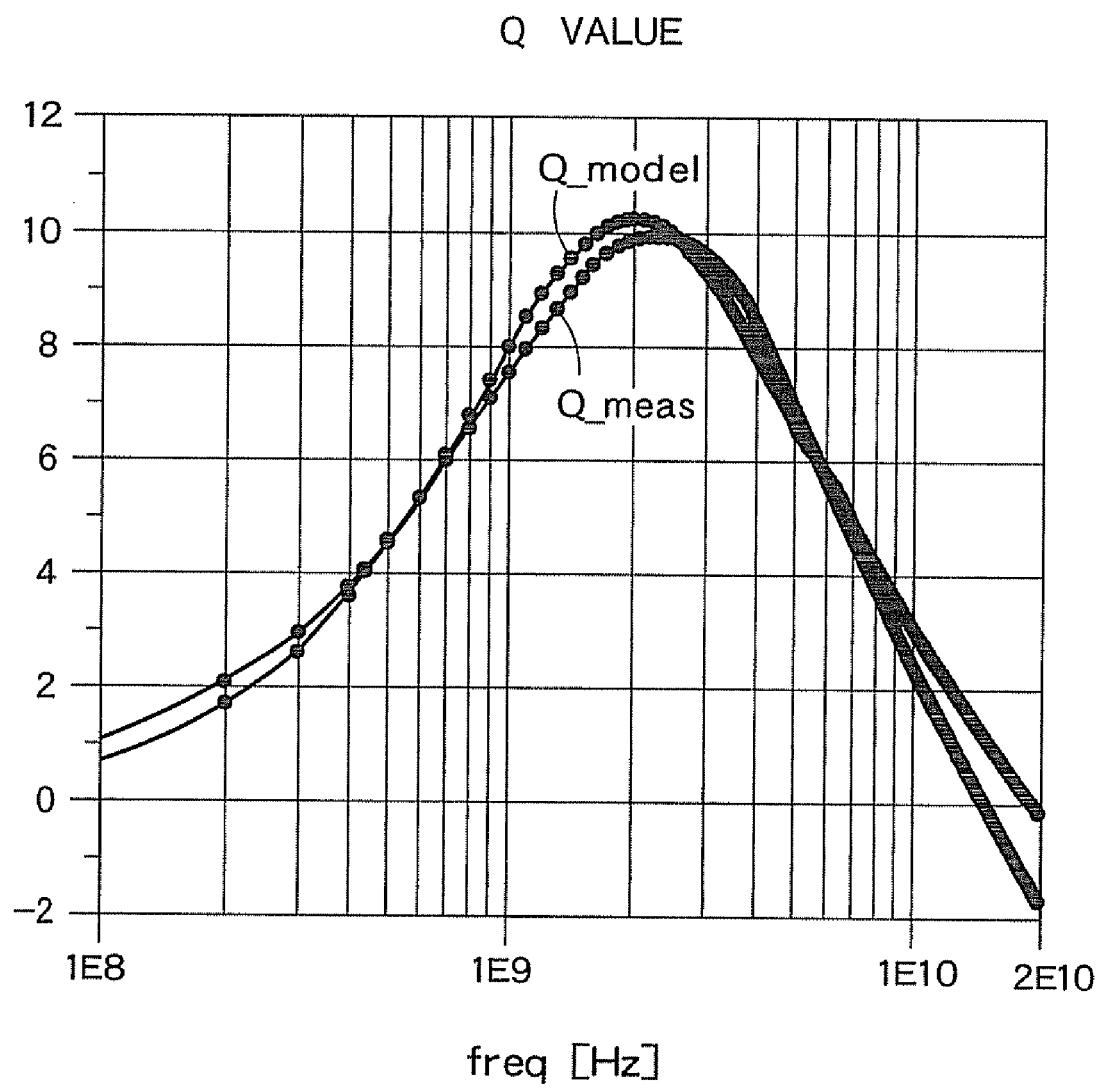
F I G. 14

APPARATUS AND METHOD OF EXTRACTING EQUIVALENT CIRCUIT OF T-TYPE TRANSMISSION CIRCUIT

CROSS REFERENCE TO RELATED APPLICATIONS

This application is based upon and claims the benefit of priority from the prior Japanese Patent Application No. 2007-225824, filed on Aug. 31, 2007, the entire contents of which are incorporated herein by reference.

BACKGROUND OF THE INVENTION

1. Field of the Invention

The present invention relates to an apparatus and a method of extracting an equivalent circuit of a T-type transmission circuit having an AC current ground terminal, and first and second terminals for signal transmission.

2. Related Art

There are a number of known techniques related to an inductor model formed on a semiconductor substrate. Such known techniques relate to an equivalent circuit assuming a two-terminal structure having one input terminal and one output terminal (for example, refer to John R. Long and Miles A. Copeland, "Modeling of Monolithic Inductors and Transformers for Silicon RFIC Design", MTT-S 1995 International Topical Symposium pp. 129-134).

The above document discloses the following. When the inductor model is constructed, a large number of impedances of elements formed on a silicon substrate is actually measured with a network analyzer, or the like; the measured values are converted to four-terminal equivalent circuit parameters (i.e. Y parameter or Z parameter), or the like; and in consideration of a configuration of the equivalent circuit, equivalent circuit values (i.e. values of elements such as an inductor and a resistor used in the above equivalent circuit) of the equivalent circuit are extracted.

Recently, the inductors are frequently utilized in a three-terminal structure. For example, the inductors are utilized in a structure having a center-tap in a Voltage Controlled Oscillator (VCO), and are utilized in a configuration for an ON-Chip transformer. In addition, there are increased needs to easily and accurately extract the equivalent circuit values of a three-terminal inductor as there are increased instances where an electromagnetic analysis is utilized to estimate the inductor characteristics.

In an equivalent circuit value calculating method described in the above document, it is assumed that the two-terminal inductor is used. Therefore, this method can not be directly used to extract the equivalent circuit values of the three-terminal inductor, which is a significant problem.

As a method for extracting the equivalent circuit value, there is a known method in which a measured value or an electromagnetic field analysis calculated value are used as a reference value, the equivalent circuit value is swept on a simulator, and a combination of values which are the closest to the measured value is obtained. This method, however, has a problem that the obtained result depends on an initial value utilized or an operator of the simulator, and it is not possible to accurately determine whether or not the obtained result is physically correct.

In addition, there is a latest simulator having a program in which the circuit configuration and the equivalent circuit value which are the most suitable to the targeted S parameter are automatically combined to generate the equivalent circuit. It is not assured for the same reason as the above that a circuit designer can obtain significant information in a short period.

SUMMARY OF THE INVENTION

According to one aspect of the present invention, a method of extracting an equivalent circuit of a T-type transmission circuit, the T-type transmission circuit having a ground terminal for an AC signal and first and second terminals for signal transmission, the equivalent circuit having a T-type circuit and a $\pi$-type circuit, the T-type circuit having:
a first lead line constant part, one end of which is connected to the first terminal and which has a first lead line resistor and a first lead line inductor connected in series;
a second lead line constant part, one end of which is connected to the second terminal, the other end of which is connected to the other end of the first lead line contact part and which has a second lead line resistor and a second lead line inductor connected in series;
a third lead line constant part, one end of which is connected to the ground terminal, the other end of which is connected to the other end of the first lead line constant part and the other end of the second lead line constant part, and which has a third lead line resistor and a third lead line inductor connected in series, the $\pi$-type circuit having:
a first impedance circuit generated by a first coupling capacitor and an eddy current loss which are connected in series between the first terminal and the ground terminal;
a second impedance circuit generated by a second coupling capacitance and an eddy current loss which are connected in series between the second terminal and the ground terminal; and
a third coupling capacitor connected between the first and second terminals, the method comprising:

measuring signals of the first and second terminals to obtain S parameters;

converting the S parameters into Z parameters to generate the T-type circuit by using the Z parameters;

obtaining the first to third lead line resistors and the first to third lead line inductors in the T-type circuit based on the Z parameters corresponding to constants of the T-type circuit;

subtracting the Z parameters corresponding to the T-type circuit from the Z parameters corresponding to all of the equivalent circuit to calculate the Z parameters of the $\pi$-type circuit;

converting the Z parameters of the $\pi$-type circuit into the Y parameters; and calculating the first to third coupling capacitances based on the Y parameters.

According to the other aspect of the present invention, an apparatus of extracting an equivalent circuit of a T-type transmission circuit, the T-type transmission circuit having a ground terminal for an AC signal and first and second terminals for signal transmission, the equivalent circuit having a T-type circuit and a $\pi$-type circuit, the T-type circuit having:
a first lead line constant part, one end of which is connected to the first terminal and which has a first lead line resistor and a first lead line inductor connected in series;

a second lead line constant part, one end of which is connected to the second terminal, the other end of which is connected to the other end of the first lead line contact part and which has a second lead line resistor and a second lead line inductor connected in series;

a third lead line constant part, one end of which is connected to the ground terminal, the other end of which is connected to the other end of the first lead line constant part and the other end of the second lead line constant part, and which has a third lead line resistor and a third lead line inductor connected in series, the π-type circuit having:

a first impedance circuit generated by a first coupling capacitor and an eddy current loss which are connected in series between the first terminal and the ground terminal;

a second impedance circuit generated by a second coupling capacitance and an eddy current loss which are connected in series between the second terminal and the ground terminal; and a third coupling capacitor connected between the first and second terminals, the apparatus comprising:

measuring signals of the first and second terminals to obtain S parameters;

converting the S parameters into Z parameters to generate the T-type circuit by using the Z parameters;

obtaining the first to third lead line resistors and the first to third lead line inductors in the T-type circuit based on the Z parameters corresponding to constants of the T-type circuit;

subtracting the Z parameters corresponding to the T-type circuit from the Z parameters corresponding to all of the equivalent circuit to calculate the Z parameters of the π-type circuit;

converting the Z parameters of the π-type circuit into the Y parameters; and calculating the first to third coupling capacitances based on the Y parameters.

BRIEF DESCRIPTION OF THE DRAWINGS

FIG. 2 is a circuit diagram illustrating an example of an equivalent circuit of the transformer of FIG. 1;

FIG. 5 is a diagram illustrating an example of a T-type circuit using the three-terminal Z parameter;

FIG. 6 is a graph illustrating a calculation result for first to third lead line resistors Rind_i;

FIG. 9 is a graph illustrating a calculation result for first and second coupling capacitors Cox1 and Cox2;

FIG. 10 is a graph illustrating a calculation result for third coupling capacitor Cox3;

FIG. 13A is a graph of S11 and S22;

FIG. 13B is a graph of S21 and S12; and

FIG. 14 is a diagram illustrating a calculation result and a measured value for the frequency characteristics of the Q value in the equivalent circuit.

DETAILED DESCRIPTION OF THE INVENTION

An embodiment of the present invention will be described below with reference to the drawings.

An equivalent circuit of a transformer having a center tap will be described below as an example of a T-type equivalent circuit.

Figure 1:
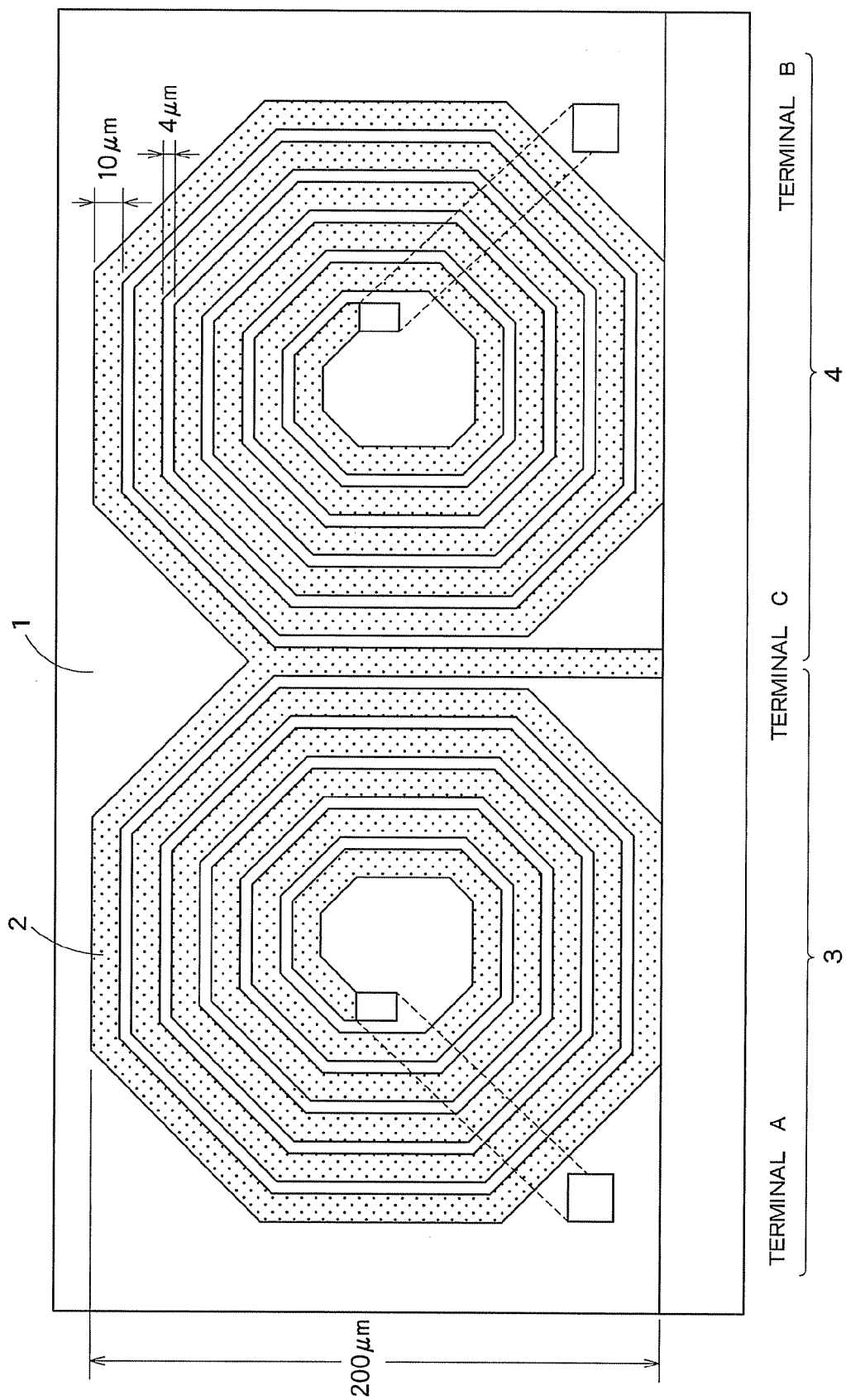
FIG. 1 is a plan view illustrating an example of a transformer.

FIG. 1 is a plan view illustrating an example of a transformer. The transformer of FIG. 1 is formed by using a spiral pattern 2. The transformer of FIG. 1 includes a first terminal A and a second terminal B for transmitting a signal, and an AC current ground terminal C (i.e. center tap). In FIG. 1, a part between the terminal A and the terminal C corresponds to a coil 3 of a primary side, and a part between the terminal B and the terminal C corresponds to a coil 4 of a secondary side.

In the transformer of FIG. 1, an outside diameter is 200 μm, a width of a pattern 2 is 10 μm, a clearance between the patterns 2 is 4 μm, the number of turns is 6 in both of the primary side and the secondary side, structures of the primary side coil 3 and the secondary side coil 4 are symmetric, and the center tap is provided on a symmetric axis.

FIG. 2 is a circuit diagram illustrating an example of the equivalent circuit of the transformer of FIG. 1. The equivalent circuit of FIG. 2 is configured with a combination of a T-type circuit part 5 and a π-type circuit part 6.

The T-type circuit part 5 includes a first lead line constant part 11 one end of which is connected to the first terminal A and which includes a first lead line resistor Rind_1 and a first lead line inductor Lind_1 serially connected with each other, a second lead line constant part 12 one end of which is connected to the second terminal B and the other end of which is connected to the other end of the first lead line constant part 11 and which includes a second lead line resistor Rind_2 and a second lead line inductor Lind_2 serially connected with each other, and a third lead line constant part 13 one end of which is connected to a ground terminal and the other end of which is connected to the other end of the first lead line constant part 11 and the other end of the second lead line constant part 12 and which includes a third lead line resistor Rind_3 and a third lead line inductor Lind_3 serially connected with each other.

The π-type circuit part 6 includes a first coupling capacitor Cox1 and a first impedance circuit Zsub 1 due to an eddy current loss which are serially connected between the first terminal A and the ground terminal, a second coupling capacitor Cox2 and a second impedance circuit Zsub 2 due to the eddy current loss which are serially connected between the second terminal B and the ground terminal, and a third coupling capacitor Cox3 which is connected between the first terminal A and the second terminal B.

The first impedance circuit Zsub 1 includes a first eddy current loss resistor Rs1 and a first eddy current loss capacitor Cs1 which are connected in parallel, and the second impedance circuit Zsub 2 includes a second eddy current loss resistor Rs2 and a second eddy current loss capacitor Cs2 which are connected in parallel.

Figure 3:
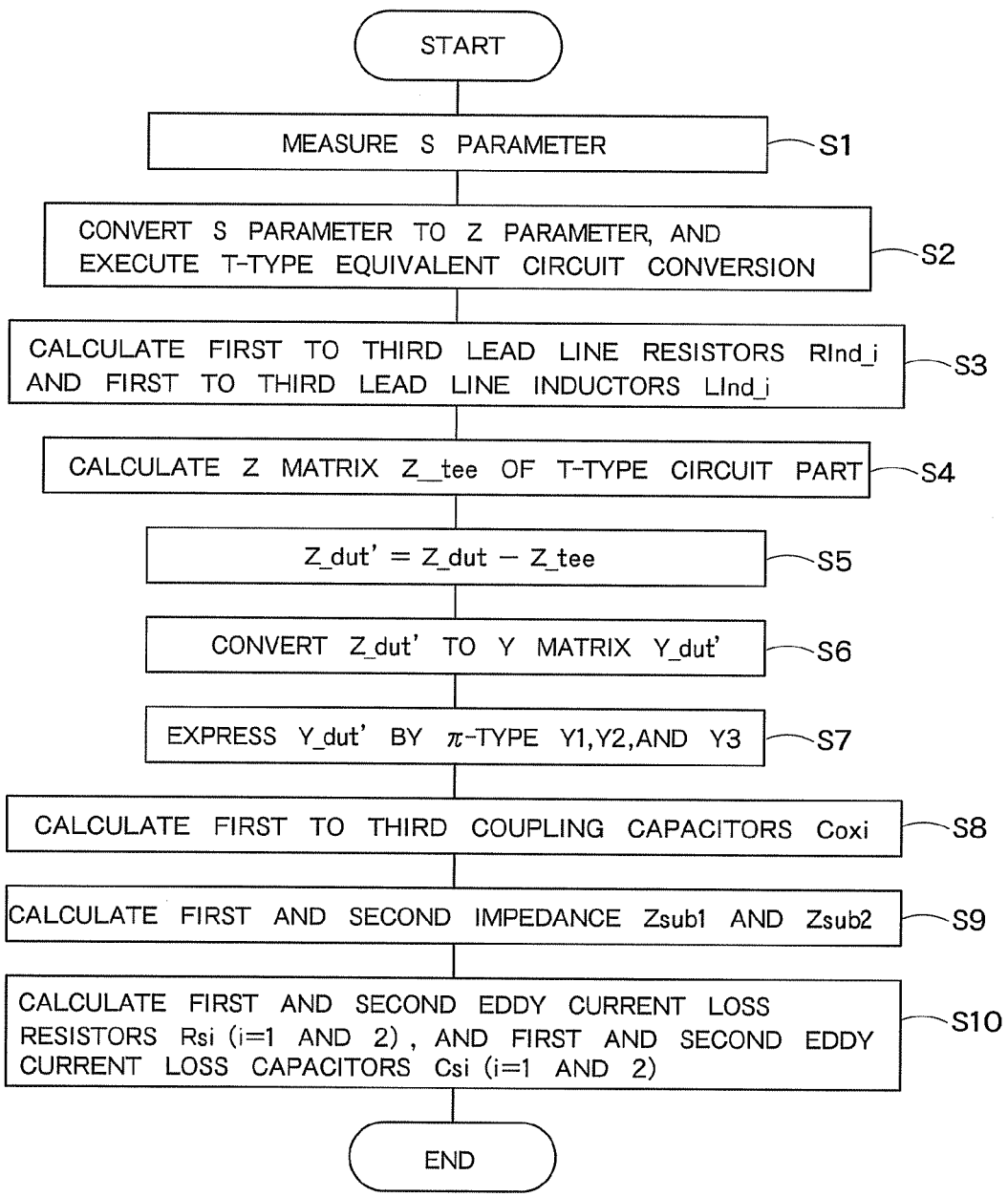
FIG. 3 is a flowchart illustrating an example of a procedure for extracting each circuit constant in the circuit diagram of FIG. 2.

FIG. 3 is a flowchart illustrating an example of a procedure for extracting each circuit constant in the equivalent circuit of FIG. 2. The flowchart of FIG. 3 is generally programmed to be executed by a computer. Alternatively, specific hardware may be provided which can execute the flowchart of FIG. 3. Otherwise, the flowchart of FIG. 3 may be processed by dividing the processes into multiple apparatuses.

A method will be described below based on the flowchart of FIG. 3, which extracts each circuit constant in the equivalent circuit of FIG. 2. First of all, the first and second terminals A and B of the transformer of FIG. 1 are connected to a two-port network analyzer (not-illustrated), and the S parameter is measured (step S1).

Next, the measured S parameter is converted to the Z parameter, and the T-type equivalent circuit conversion is executed (step S2).

The T-type equivalent circuit conversion in step S2 will be described in detail below.

Figure 4:
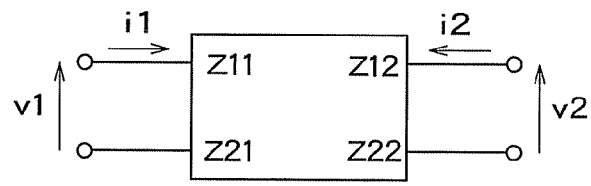
FIG. 4 is a diagram illustrating an example of a transmission circuit including the four-terminal Z parameter.

FIG. 4 is a diagram illustrating an example of a transmission circuit including the four-terminal Z parameter. FIG. 5 is a diagram illustrating an example of the T-type circuit using the three-terminal Z parameter. In FIG. 4, the Z parameters are designated as Z11, Z12, Z21, and Z22, and in FIG. 5, the Z parameters are designated as Z1, Z2, and Z3.

From FIG. 4, the following equations (1) and (2) are derived.

$$v1 = Z11 \cdot i1 + Z12 \cdot i2 \quad (1)$$

$$v2 = Z21 \cdot i1 + Z22 \cdot i2 \quad (2)$$

From FIG. 5, the following equations (3) and (4) are derived.

$$v1 = Z1 \cdot i1 + Z3 \cdot (i1+i2) \quad (3)$$

$$v2 = Z2 \cdot i2 + Z3 \cdot (i1+i2) \quad (4)$$

If the above equations (3) and (4) are modified, the following equations (5) and (6) are obtained.

$$v1 = (Z1+Z3) \cdot i1 + Z3 \cdot i2 \quad (5)$$

$$v2 = (Z2+Z3) \cdot i2 + Z3 \cdot i1 \quad (6)$$

If the above equations (5) and (6) are compared with the above equations (1) and (2), the following equations (7) to (9) are obtained.

$$Z11 = Z1 + Z3 \quad (7)$$

$$Z12 = Z21 = Z3 \quad (8)$$

$$Z22 = Z2 + Z3 \quad (9)$$

If the above equation (8) is modified, Z12+Z21=2×Z3 is derived, and the following equation (10) is obtained.

$$Z3 = 0.5 \times (Z12+Z21) \quad (10)$$

If the above equation (8) is substituted for the above equation (7), the following equation (11) is obtained.

$$Z11 = Z1 + Z12(=Z21) \quad (11)$$

If this equation (11) is substituted for the above equation (10), the following equation (12) is obtained.

$$Z1 = Z11 - 0.5 \times (Z12+Z21) \quad (12)$$

If the above equation (10) is substituted for the above equation (9), the following equation (13) is obtained.

$$Z2 = Z22 - 0.5 \times (Z12+Z21) \quad (13)$$

Each value of the above equations (12), (13), and (10) is a result of the T-type equivalent circuit conversion.

The T-type circuit including the Z parameters indicated in the above equations (12), (13), and (10) corresponds to the T-type circuit 5 of FIG. 2, and the following equations (14) to (16) are derived.

$$Z1 = Rind\_1 + j\omega Lind\_1 \quad (14)$$

$$Z2 = Rind\_2 + j\omega Lind\_2 \quad (15)$$

$$Z3 = Rind\_3 + j\omega Lind\_3 \quad (16)$$

As indicated in the above equations (14) to (16), real number components of Z1, Z2, and Z3 correspond to the first to third lead line resistors Rind_i (i=1 to 3), and imaginary number components correspond to the first to third lead line inductors Lind_i.

As described above, by calculating Z1, Z2, and Z3 from the above equations (12), (13), and (10), it is possible to obtain the first to third lead line resistors Rind_i and the first to third lead line inductors Lind_i (step S3).

Figure 7:
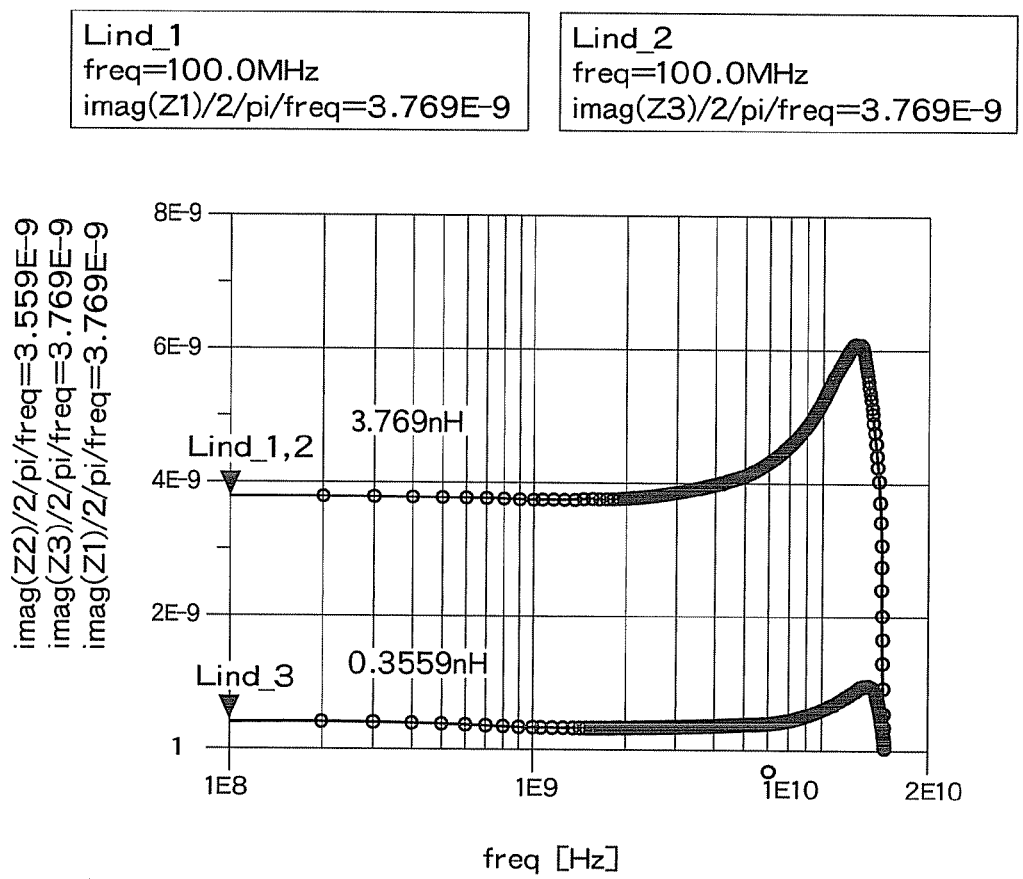
FIG. 7 is a graph illustrating a calculation result for first to third lead line inductors Lind_i.

FIG. 6 is a graph illustrating a calculation result for the first to third lead line resistors Rind_i, and FIG. 7 is a graph illustrating a calculation result for the first to third lead line inductors Lind_i. In FIG. 6 and FIG. 7, a horizontal axis corresponds to a frequency. A horizontal axis of FIG. 6 is the real number component of the above equations (14) to (16), and corresponds to the first to third lead line resistors Rind_i. A horizontal axis of FIG. 7 is the imaginary number component of the above equations (14) to (16), and corresponds to the first to third lead line inductors Lind_i.

Since a structure of the equivalent circuit of FIG. 2 is symmetric, the first and second lead line resistors Rind_1 and Rind_2 become equal to each other, and the first and second lead line inductors Lind_1 and Lind_2 also become equal to each other. The calculation results for the first to third lead line resistors Rind_i and the first to third lead line inductors Lind_i vary according to the frequency. Thus, the optimum value is selected from the values which are calculated in as a low frequency as possible. It is desirable as a guide that the first to third lead line resistors Rind_i and the first to third lead line inductors Lind_i are calculated in a frequency area which is equal to or less than 1/1000 of a frequency fosc defined by the following equation (17).

$$f_{osc} = \frac{1}{2\pi\sqrt{L_{ind\_i} C_{ox3}}} \quad (17)$$

Since the first to third lead line inductors Lind_i and the third coupling capacitor Cox3 are frequently unknown in advance, it is desirable, more specifically, to calculate the first to third lead line resistors Rind_i and the first to third lead line inductors Lind_i in the frequency area of 200 MHz or less.

Next, by using the Z parameters Z1, Z2, and Z3 indicated in the above equations (14) to (16), a Z matrix Z_tee of the T-type circuit part 5 is calculated (step S4). Four components Ztee11, Ztee12, Ztee21, Ztee22 of the Z matrix Z_tee are expressed as the following equations (18) to (20) by using the above equations (7) to (9).

$$Ztee11 = Z1+Z3 = (Rind\_1+Rind\_3) + j\omega(Lind\_1+Lind\_3) \quad (18)$$

$$Ztee22 = Z2+Z3 = (Rind\_2+Rind\_3) + j\omega(Lind\_2+Lind\_3) \quad (19)$$

$$Ztee12 = Ztee21 = Rind\_3 + j\omega Lind\_3 \quad (20)$$

Next, as indicated in the following equation (21), by subtracting the Z matrix Z_tee of the T-type circuit part 5 from a Z matrix Z_dut of the whole circuit of FIG. 2, a Z matrix Z_dut' of the π-type circuit part 6 is calculated (step S5).

$$Z\_dut' = Z\_dut - Z\_tee \quad (21)$$

Next, the Z matrix Z_dut' is converted to a Y matrix Y_dut' (step S6).

The following relations are derived by using a four-terminal Y matrix.

$$i1 = Y11 \cdot v1 + Y12 \cdot v2 \quad (22)$$

$$i2 = Y21 \cdot v1 + Y22 \cdot v2 \quad (23)$$

If the equations (22) and (23) are substituted for i1 and i2 of the above equations (1) and (2), the following equations (24) and (25) are obtained.

$$(Z11 \cdot Y11 + Z12 \cdot Y21 - 1)v1 + (Z11 \cdot Y12 + Z12 \cdot Y22)v2 = 0 \quad (24)$$

$$(Z21 \cdot Y11 + Z22 \cdot Y21 - 1)v1 + (Z21 \cdot Y12 + Z22 \cdot Y22 - 1)v2 = 0 \quad (25)$$

In the above equations (24) and (25), the conditions, on which identities of v1 and v2 are derived, are the following equations (26) to (29).

$$Z11 \cdot Y11 + Z12 \cdot Y21 - 1 = 0 \quad (26)$$

$$Z11 \cdot Y12 + Z12 \cdot Y22 = 0 \quad (27)$$

$$Z21 \cdot Y11 + Z22 \cdot Y21 = 0 \quad (28)$$

$$Z21 \cdot Y22 + Z22 \cdot Y22 - 1 = 0 \quad (29)$$

By designating the above equations (26) to (29) as simultaneous equations, the Y11, Y12, Y21, and Y22 can be calculated.

Figure 8:
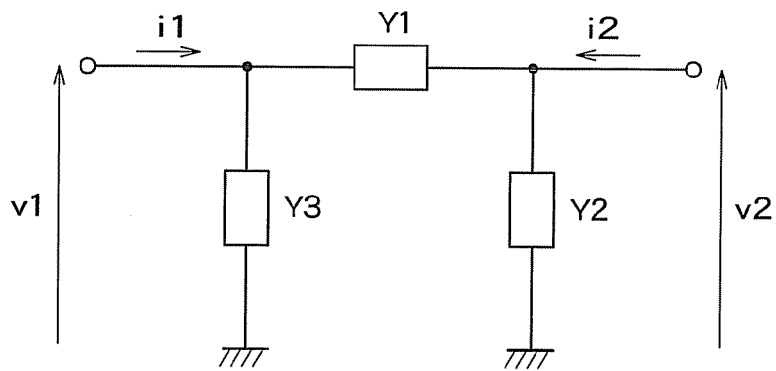
FIG. 8 is a diagram illustrating an example of a π-type circuit using the Y parameter.

Here, the Y matrix Y_dut' can be expressed by using three admittances Y1, Y2, and Y3 which are connected other in a π-type (step S7). FIG. 8 is a diagram illustrating an example of the π-type circuit using the Y parameters. The following equations (30) and (31) are obtained from FIG. 8.

$$i1 = Y11 \cdot v1 + Y12 \cdot v2 \quad (30)$$

$$i2 = Y21 \cdot v1 + Y22 \cdot v2 \quad (31)$$

If the above equations (30) and (31) are modified, the following equations (32) and (33) are obtained.

$$i1 = (Y1 + Y3)v1 - Y3 \cdot v2 \quad (32)$$

$$i2 = -Y3 \cdot v1 + (Y2 + Y3)v2 \quad (33)$$

The following equations (34) to (36) are obtained from the above equations (32) and (33), and the above equations (30) and (31).

$$Y1 = Y11 + 0.5(Y21 + Y12) \quad (34)$$

$$Y2 = Y22 + 0.5(Y21 + Y12) \quad (35)$$

$$Y3 = -0.5(Y21 + Y12) \quad (36)$$

Next, the first to third coupling capacitors Coxi (i=1 to 3) are calculated based on the following equations (37) and (38) by using the three admittances Y1, Y2, and Y3 (step S8).

An imaginary number component of a reciprocal of the admittance Yi is expressed by the following equation (37).

$$Imag\left(\frac{1}{Y_i}\right) = \frac{-1}{\omega \cdot C_{oxi}} = \frac{-1}{2\pi \cdot freq \cdot C_{oxi}} \quad (37)$$

The above equation (37) is modified to become the following equation (38), and the first to third coupling capacitors Coxi are obtained.

$$C_{oxi} = \frac{-1}{2\pi \cdot freq \cdot Imag\left(\frac{1}{Y_i}\right)} \quad (38)$$

FIG. 9 is a graph illustrating a calculation result for the first and second coupling capacitors Cox1 and Cox2, and FIG. 10 is a graph illustrating a calculation result for the third coupling capacitor Cox3. A horizontal axis of FIG. 9 and FIG. 10 corresponds to a frequency. As illustrated in such figures, calculation results of the first to third coupling capacitors Coxi vary according to the frequency. Thus, the maximum value is selected for the first and second coupling capacitors Cox1 and Cox2 in as a low frequency area as possible, and the maximum value is selected for the third coupling capacitor Cox3 in as a high frequency area as possible.

Next, the first and second impedance circuits Zsub 1 and Zsub 2 are calculated, which are serially connected to the first and second coupling capacitors Cox1 and Cox2 (step S9). The first impedance circuit Zsub 1 is obtained by connecting the first eddy current loss resistor Rs1 and the first eddy current loss capacitor Cs1 in parallel, and is expressed by the following equation (39). The second impedance circuit Zsub 2 is obtained by connecting the second eddy current loss resistor Rs2 and the second eddy current loss capacitor Cs2 in parallel, and is expressed by the following equation (40).

$$Z_{sub1} = \frac{1}{\frac{1}{R_{s1}} + j\omega C_{s1}} \quad (39)$$

$$Z_{sub2} = \frac{1}{\frac{1}{R_{s2}} + j\omega C_{s2}} \quad (40)$$

From the above equations (39) and (40), the first and second eddy current loss resistors Rsi (i=1 and 2), and the first and second eddy current loss capacitors Csi (i=1 and 2) are calculated (step S10). The first and second eddy current loss resistors Rsi (i=1 and 2), and the first and second eddy current loss capacitors Csi (i=1 and 2) are expressed by the following equations (41) and (42) respectively.

$$R_{si} = \frac{1}{real\left(\frac{1}{Z_{subi}}\right)} \quad (41)$$

$$C_{si} = \frac{Imag\left(\frac{1}{Z_{subi}}\right)}{2\pi freq} \quad (42)$$

As indicated in the above equations (41) and (42), the first and second eddy current loss resistors Rsi are real number components of the above equations (39) and (40), and the first and second eddy current loss capacitors Csi are imaginary number component of the above equations (39) and (40).

Figure 11:
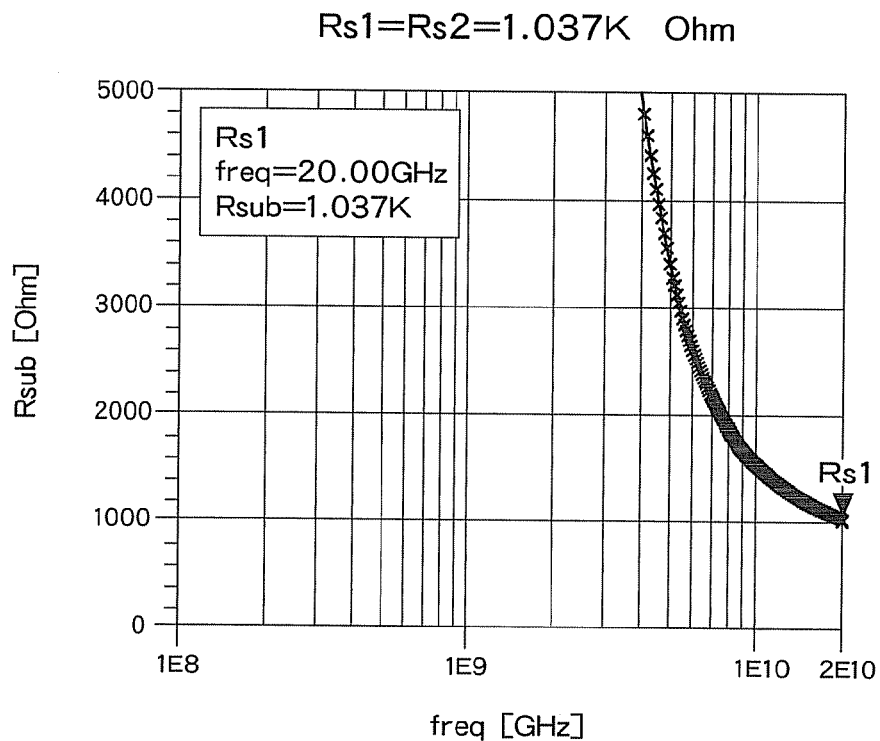
FIG. 11 is a graph illustrating a calculation result for first and second eddy current loss resistors Rsi.
Figure 12:
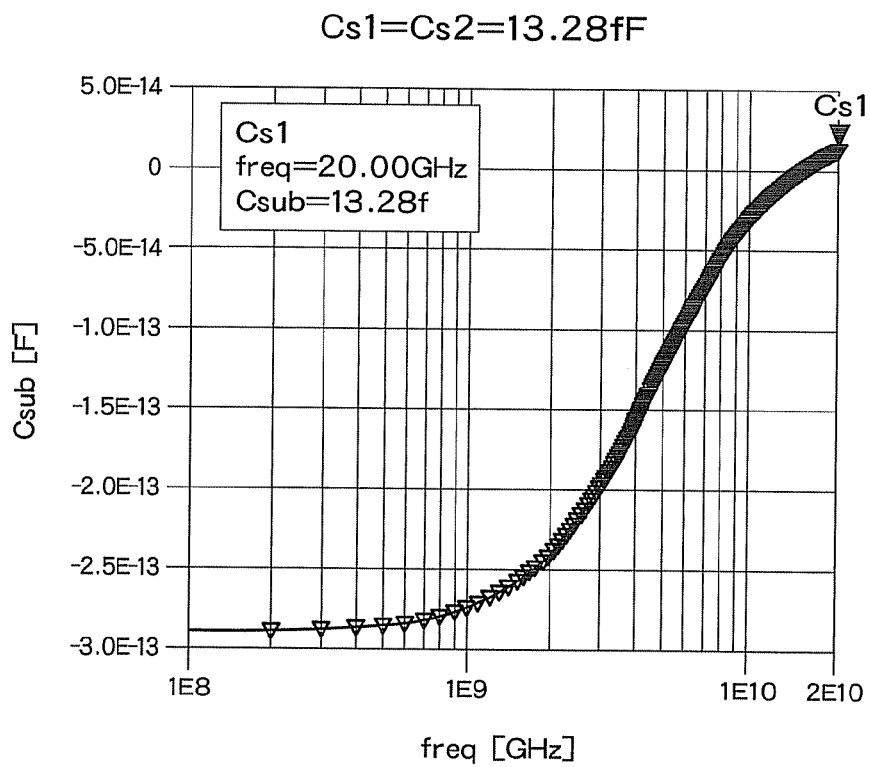
FIG. 12 is a graph illustrating a calculation result for first and second eddy current loss capacitors Csi.

FIG. 11 is a graph illustrating a calculation result for the first and second eddy current loss resistors Rsi, and FIG. 12 is a graph illustrating a calculation result for the first and second eddy current loss capacitors Csi. In such figures, a horizontal axis corresponds to a frequency. As illustrated in such figures, while the calculation results for the first and second eddy current loss resistors Rsi and the first and second eddy current loss capacitors Csi largely vary, the calculation results are extracted in as a high frequency as possible.

As described above, each circuit constant in the equivalent circuit of FIG. 2 can be extracted.

FIG. 13 is a graph illustrating a calculation result and a measured value of the S parameter of the equivalent circuit in which each circuit constant is extracted by the flowchart of FIG. 3, and FIG. 13A illustrates a graph of a reflection coefficient. Dots illustrate measured value of S11 and S22, and solid lines illustrate the value extracted by the present invention and the simulation result when the equivalent circuit illustrated in FIG. 2 is used. Because of the symmetrical configuration of the circuit illustrated in FIG. 2, both S11 and S22 are the identically same and traces of two perfectly match. FIG. 13B illustrates a graph of a transmission gain. Dots illustrate the measured value of S12 and S21, and solid lines illustrate the value extracted by the present invention and a simulation result when the equivalent circuit illustrated in FIG. 2 is used. By the same reason described in the explanation of FIG. 13A, both S12 and S21 are the identically same and traces of two perfectly match. In FIG. 13B, while the divergence may be imaged between S12 and S21, the value to be compared is actually very small (at most, around 0.01), so that it is reasonable to ignore this divergence. FIG. 14 is a diagram illustrating the calculation result and the measured value for the frequency characteristics of the Q value in the equivalent circuit. In FIG. 13 and FIG. 14, the graph of the calculation result is illustrated by a solid line, and the measured value is illustrated by a dash line.

As illustrated in FIG. 13 and FIG. 14, the calculation result is close to the measured value, so that it is apparent that the accuracy of a modeling for extracting the equivalent circuit in the present embodiment is very high.

As described above, in the present embodiment, the equivalent circuit as illustrated in FIG. 2 is generated for the T-type transmission circuit with the three terminals such as the transformer having the center tap, this equivalent circuit is separately electromagnet field-analyzed in each of the π-type circuit part 6 and the T-type circuit part 5, each circuit constant in the equivalent circuit is directly calculated without the optimization using the simulation, so that a variety of the T-type transmission circuits can be designed in a short time. Particularly, when adopting the equivalent circuit extracting method according to the present embodiment, it is possible to obtain the modeling accuracy which is extremely close to the measured value through a wide band from a direct current to a high frequency (i.e. around 20 GHz), to suppress the design error to be minimum, and to widely shorten a design term for a variety of semiconductor integrated circuits incorporating the T-type transmission circuit. By applying the present embodiment, it becomes possible to develop a process design kit for an inductor in a short time.

In the above embodiment, while the equivalent circuit of the transformer having the center tap has been described as an example of the T-type transmission circuit, the present invention can be widely applied to a variety of the T-type transmission circuits with at least, the three terminals.

At least a portion of functions performed by the above-mentioned equivalent circuit extracting method and equivalent circuit extracting apparatus may be constituted by at least one of hardware and software. When constituted by software, a program of executing at least a portion of the functions performed by the equivalent circuit extracting method and the equivalent circuit extracting apparatus is stored in a recording media such as a floppy disk or CD-ROM, and is loaded to a computer to execute its program. The recording media is not limited to a portable media such a magnetic disk or an optical disk, but a fixed recording media such as a hard disk drive or a memory may be used to store the program.

The program of executing at least a portion of the functions performed by the equivalent circuit extracting method and the equivalent circuit extracting apparatus may be distributed via a communication line such as Internet. The program may be distributed via a wired line or a wireless line such as Internet at a state of encrypting, modulating or compressing the program, or may be distributed at a state of being stored in the recording media.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method of extracting an equivalent circuit of a T-type transmission circuit,
the T-type transmission circuit having a ground terminal for an AC signal and first and second terminals for signal transmission,
the equivalent circuit having a T-type circuit and a π-type circuit,
the T-type circuit having:
    a first lead line constant part, one end of which is connected to the first terminal and which has a first lead line resistor and a first lead line inductor connected in series;
    a second lead line constant part, one end of which is connected to the second terminal, the other end of which is connected to the other end of the first lead line contact part and which has a second lead line resistor and a second lead line inductor connected in series;
    a third lead line constant part, one end of which is connected to the ground terminal, the other end of which is connected to the other end of the first lead line constant part and the other end of the second lead line constant part, and which has a third lead line resistor and a third lead line inductor connected in series,
the π-type circuit having:
    a first impedance circuit generated by a first coupling capacitor and an eddy current loss which are connected in series between the first terminal and the ground terminal;
    a second impedance circuit generated by a second coupling capacitance and an eddy current loss which are connected in series between the second terminal and the ground terminal; and
    a third coupling capacitor connected between the first and second terminals,
the method comprising using one or more processors to perform the following:
measuring signals of the first and second terminals to obtain S parameters;
converting the S parameters into Z parameters to generate the T-type circuit by using the Z parameters;
obtaining the first to third lead line resistors and the first to third lead line inductors in the T-type circuit based on the Z parameters corresponding to constants of the T-type circuit;

subtracting the Z parameters corresponding to the T-type circuit from the Z parameters corresponding to all of the equivalent circuit to calculate the Z parameters of the π-type circuit;

converting the Z parameters of the p-type circuit into the Y parameters; and calculating the first to third coupling capacitances based on the Y parameters.

2. The method according to claim 1, further comprising using one or more processors to perform the following:

calculating impedances of the first and second impedance circuits by using the first to third coupling capacitances.

3. The method according to claim 2, further comprising using one or more processors to perform the following:

obtaining a first eddy current loss resistor and a first eddy current loss capacitor connected in parallel based on the impedance of the first impedance circuit; and obtaining a second eddy current loss resistor and a second eddy current loss capacitor connected in parallel based on the impedance of the second impedance circuit.

4. The method according to claim 3, further comprising using one or more processors to perform the following:

wherein the first eddy current loss resistor corresponds to a real number component of an impedance of the first impedance circuit;

the first eddy current loss capacitor corresponds to an imaginary number component of an impedance of the first impedance circuit;

the second eddy current loss resistor corresponds to a real number component of an impedance of the second impedance circuit;

the second eddy current loss capacitor corresponds to an imaginary number component of an impedance of the second impedance circuit; and the first and second eddy current loss resistors and the first and second eddy current loss capacitors are obtained based on the impedance at as high frequency area as possible among the calculated impedance of the first impedance circuit.

5. The method according to claim 1, wherein:

the first to third lead line resistors are obtained by the real number components of the Z parameters corresponding to the generated T-type circuit; and the first to third lead line inductors are obtained by the imaginary number components of the Z parameters.

6. The method according to claim 1, wherein the first to third lead line resistors and the first to third lead line inductors are obtained based on a result of calculating the Z parameters corresponding to the constants of the generated T-type circuit at a frequency area equal to or less than a predetermined frequency.

7. The method according to claim 1, wherein the first and second coupling capacitor are set based on a maximum value calculated at as a low frequency area as possible.

8. The method according to claim 1, wherein the third coupling capacitor is set based on a maximum value calculated at as a high frequency area as possible.

9. The method according to claim 1, wherein the first to third coupling capacitors are obtained by using three admittances connected to it-type as the Y parameter.

10. The method according to claim 1, wherein:

the T-type transmission circuit is a transformer having spiral patterns formed on a substrate; and the ground terminal is a center tap of the transformer.

11. An apparatus of extracting an equivalent circuit of a T-type transmission circuit, the T-type transmission circuit having a ground terminal for an AC signal and first and second terminals for signal transmission, the equivalent circuit having a T-type circuit and a it-type circuit, the T-type circuit having:

a first lead line constant part, one end of which is connected to the first terminal and which has a first lead line resistor and a first lead line inductor connected in series;

a second lead line constant part, one end of which is connected to the second terminal, the other end of which is connected to the other end of the first lead line contact part and which has a second lead line resistor and a second lead line inductor connected in series;

a third lead line constant part, one end of which is connected to the ground terminal, the other end of which is connected to the other end of the first lead line constant part and the other end of the second lead line constant part, and which has a third lead line resistor and a third lead line inductor connected in series, the π-type circuit having:

a first impedance circuit generated by a first coupling capacitor and an eddy current loss which are connected in series between the first terminal and the ground terminal;

a second impedance circuit generated by a second coupling capacitance and an eddy current loss which are connected in series between the second terminal and the ground terminal; and a third coupling capacitor connected between the first and second terminals, the apparatus being configured to:

measure signals of the first and second terminals to obtain S parameters;

convert the S parameters into Z parameters to generate the T-type circuit by using the Z parameters;

obtaining the first to third lead line resistors and the first to third lead line inductors in the T-type circuit based on the Z parameters corresponding to constants of the T-type circuit;

subtract the Z parameters corresponding to the T-type circuit from the Z parameters corresponding to all of the equivalent circuit to calculate the Z parameters of the π-type circuit;

convert the Z parameters of the π-type circuit into the Y parameters; and calculate the first to third coupling capacitances based on the Y parameters.

12. The apparatus according to claim 11, the apparatus being further configured to:

calculate impedances of the first and second impedance circuits by using the first to third coupling capacitances.

13. The apparatus according to claim 12, the apparatus being further configured to:

obtain a first eddy current loss resistor and a first eddy current loss capacitor connected in parallel based on the impedance of the first impedance circuit; and obtain a second eddy current loss resistor and a second eddy current loss capacitor connected in parallel based on the impedance of the second impedance circuit.

14. The apparatus according to claim 13, wherein the first eddy current loss resistor corresponds to a real number component of an impedance of the first impedance circuit;

the first eddy current loss capacitor corresponds to an imaginary number component of an impedance of the first impedance circuit;

the second eddy current loss resistor corresponds to a real number component of an impedance of the second impedance circuit;

the second eddy current loss capacitor corresponds to an imaginary number component of an impedance of the second impedance circuit; and the first and second eddy current loss resistors and the first and second eddy current loss capacitors are obtained based on the impedance at as high frequency area as possible among the calculated impedance of the first impedance circuit.

15. The apparatus according to claim 11, wherein:

the first to third lead line resistors are obtained by the real number components of the Z parameters corresponding to the generated T-type circuit; and the first to third lead line inductors are obtained by the imaginary number components of the Z parameters.

16. The apparatus according to claim 11, wherein the first to third lead line resistors and the first to third lead line inductors are obtained based on a result of calculating the Z parameters corresponding to the constants of the generated T-type circuit at a frequency area equal to or less than a predetermined frequency.

17. The apparatus according to claim 11, wherein the first and second coupling capacitor are set based on a maximum value calculated at as a low frequency area as possible.

18. The apparatus according to claim 11, wherein the second coupling capacitor is set based on a maximum value calculated at as a high frequency area as possible.

19. The apparatus according to claim 11, wherein the first to third coupling capacitors are obtained by using three admittances connected to π-type as the Y parameter.

20. The apparatus according to claim 11, wherein:

the T-type transmission circuit is a transformer having spiral patterns formed on a substrate; and the ground terminal is a center tap of the transformer.

* * * * *